United States Patent [19]

Horikawa et al.

[11] Patent Number: 5,018,359

[45] Date of Patent: May 28, 1991

[54] CRYOGENIC REFRIGERATION APPARATUS

[75] Inventors: Mituo Horikawa; Kazuki Moritsu, both of Ako, Japan

[73] Assignee: Mitsubishi Denki Kabushiki Kaisha, Japan

[21] Appl. No.: 543,487

[22] Filed: Jun. 26, 1990

[30] Foreign Application Priority Data

Jun. 30, 1989 [JP] Japan .................. 1-166896

[51] Int. Cl.$^5$ ............................................. F25B 19/00
[52] U.S. Cl. .................... 62/51.1; 62/297; 248/636; 248/638; 335/216; 505/892
[58] Field of Search .............. 62/51.1, 295, 296, 297; 335/216; 505/892; 248/636, 638

[56] References Cited

U.S. PATENT DOCUMENTS

| | | | |
|---|---|---|---|
| 4,580,118 | 4/1986 | Kawamura | 335/216 |
| 4,625,192 | 11/1986 | Kawaguchi | 335/216 |
| 4,651,117 | 3/1987 | Kawaguchi et al. | 335/216 |
| 4,672,202 | 6/1987 | Crossley, Jr. et al. | 62/51.1 |
| 4,675,636 | 6/1987 | Kawaguchi | 335/216 |
| 4,707,676 | 11/1987 | Saitou et al. | 335/216 |
| 4,777,807 | 10/1988 | White | 62/51.1 |
| 4,841,268 | 6/1989 | Burnett et al. | 62/51.1 |

Primary Examiner—Ronald C. Capossela
Attorney, Agent, or Firm—Leydig, Voit & Mayer

[57] ABSTRACT

In a cryogenic refrigeration apparatus includes a thermal shield, a vacuum vessel and a magnetic shield which are telescopically arranged in that order toward the exterior of a cryogenic vessel which accommodates a superconducting coil, a refrigerator for cooling the thermal shield is securely supported on the thick-walled magnetic shield. Accordingly, vibration produced by the refrigerator is suppressed by the magnetic shield, whereby noise is suppressed which is produced in the vacuum vessel connected to the magnetic shield through a bellows.

5 Claims, 2 Drawing Sheets

FIG. I
PRIOR ART

CRYOGENIC REFRIGERATION APPARATUS

BACKGROUND OF THE INVENTION

1. Field of the Invention

The present invention relates to a cryogenic refrigeration apparatus including a thermal shield, a vacuum vessel and a magnetic shield, which are arranged in that order outwardly of a cryogenic vessel which accommodates a superconducting coil, as well as a refrigerator for cooling the thermal shield.

2. Description of the Related Art

FIG. 1 is a cross-sectional view showing one example of a conventional cryogenic refrigeration apparatus of the type which is used in a magnetic resonance diagnosis system. As illustrated, a liquid helium vessel 1 accommodates a superconducting coil 13 and is charged with liquid helium which serves as a cryogenic cooling medium to maintain the liquid helium vessel 1 at a temperature of 4.2° K. A first thermal shield 2 is disposed outwardly of and in surrounding relationship to the liquid helium vessel 1 which serves as the cryogenic vessel. The first thermal shield 2 serves to reduce the intensity of radiation heat which may enter the liquid helium vessel 1. A second thermal shield 3 is disposed outwardly of and in surrounding relationship to the first thermal shield 2 and serves to reduce the intensity of radiation heat which may enter the first thermal shield 2. A vacuum vessel 4 accommodates the liquid helium vessel 1, the first thermal shield 2 and the second thermal shield 3, and has its interior evacuated for heat insulation. A magnetic shield 14 is disposed outwardly of and in surrounding relationship to the vacuum vessel 4, and prevents magnetic fluxes generated from the superconducting coil 13 from leaking outwardly.

A refrigerator 5 cools the first thermal shield 2 and the second thermal shield 3 through a cooling pipe 5a. The cooling pipe 5a has a first-stage cooling section 6 and a second-stage cooling section 7. A second heat conducting element 8 is connected between the second thermal shield 3 and the first-stage cooling section 6 to conduct heat from the second thermal shield 3 to the first-stage cooling section 6. A first heat conducting element 9 is likewise connected between the second thermal shield 2 and the first-stage cooling section 7 to conduct heat from the first thermal shield 2 to the second-stage cooling section 7. The cooling pipe 5a extends through openings 4a and 3a, which are formed in the vacuum vessel 4 and the thermal shield 3, respectively, and provides communication between the refrigerator 5 and the thermal shields 2 and 3. The cooling pipe 5a, the first-stage cooling section 6, the second-stage cooling section 7 and the first and second heat conducting elements 8 and 9 cooperate to constitute heat conducting means. A bellows 10, which constitutes vibration absorbing means, is disposed between the vacuum vessel 4 and a flange 11 on which the refrigerator 5 is mounted. The bellows 10 holds the vacuum of the vacuum vessel 4 and elastically supports the refrigerator 5 on the vacuum vessel 4 against forces resulting from vacuum pressures so as to absorb the vibration of the refrigerator 5 which is operating. The bellows 10 may be combined with a plurality of springs (not shown) which are disposed between the flange 11 and the vacuum vessel 4. A compressor unit 12 supplies a compressed helium gas to the refrigerator 5, and electrical power to a valve actuating motor (not shown) disposed in the refrigerator 5. An electromagnetic cavity tube 100a defines in its interior an electromagnetic cavity 100 in which a magnetic field is generated by the superconducting coil 13, and is disposed to extend through openings 14b, 4b and 3b which are formed in the magnetic shield 14, the vacuum vessel 4 and the thermal shield 3, respectively. The portion of the electromagnetic cavity tube 100a which extends through the opening 4b of the vacuum vessel 4 is airtightly supported by a flange 4c. These elements constitute access means for providing external access to the magnetic field generated by the superconducting coil 13.

The operation of the conventional cryogenic refrigeration apparatus will be explained below. The amount of heat which enters the liquid helium vessel 1 varies with the change of the thermal shield temperatures. As the temperatures of the thermal shields become lower, the amount of heat which enters the liquid helium vessel 1 becomes smaller, and the consumption of liquid helium in the liquid helium vessel 1 can be reduced. More specifically, during the running of the refrigerator 5, the first-stage cooling section 6 and the second-stage cooling section 7 are cooled to approximately 80° K. and 20° K., respectively. In consequence, the second thermal shield 3 is cooled through the second heat conducting element 8, while the first thermal shield 2 is cooled through the first heat conducting element 9. Accordingly, the consumption of liquid helium is reduced.

However, the conventional cryogenic refrigeration apparatus, which is arranged in the above-described manner, has the problem that the vibration of the refrigerator 5 which is running is transmitted to the thin-walled vacuum vessel 4 and noise occurs due to the vibration of the vacuum vessel 4.

SUMMARY OF THE INVENTION

It is therefore an object of the present invention to provide a cryogenic refrigeration apparatus which is capable of suppressing noise which is produced by a vacuum vessel during the running of a refrigerator.

To achieve the above object, according to the present invention, there is provided a cryogenic refrigeration apparatus which comprises: a cryogenic vessel which accommodates a superconducting coil immersed in a cryogenic cooling medium and which is disposed in surrounding relationship to an electromagnetic cavity in which a magnetic field is produced by the superconducting coil; a vacuum vessel disposed outwardly of the cryogenic vessel with a vacuum area interposed therebetween and provided with means for defining an opening; thermal shield means which includes at least one layer disposed between the vacuum vessel and the cryogenic vessel; a magnetic shield disposed outwardly of the vacuum vessel for preventing a magnetic flux produced by the superconducting coil from leaking to the exterior, the magnetic shield having a wall thickness greater than the vacuum vessel; cooling means securely supported on the magnetic shield for cooling the thermal shield means; heat conducting means connected between the cooling means and the thermal shield means through the opening defined in the vacuum vessel for conducting to the thermal means a cooling effect provided by the cooling means; vibration absorbing means connected between the magnetic shield and the vacuum vessel so as to define the vacuum area which accommodates the cryogenic vessel, the vibration absorbing means having elasticity which substantially prevents vibration produced by the cooling means from being transmitted from the magnetic shield to the vacuum vessel; and access means for providing external access to a magnetic field which is produced in the electromagnetic cavity by the superconducting coil.

In the cryogenic refrigeration apparatus according to the present invention, the cooling means such as a refrigerator is supported on the magnetic shield so that vibration occurring during the running of the refrigerator is suppressed by the thick-walled magnetic shield and, therefore, vibration which may be transmitted to the vacuum vessel is reduced.

The above and other objects, features and advantages of the present invention will be apparent from the following description of preferred embodiments of the invention with reference to the accompanying drawings.

DESCRIPTION OF THE PREFERRED EMBODIMENT

Figure 1:
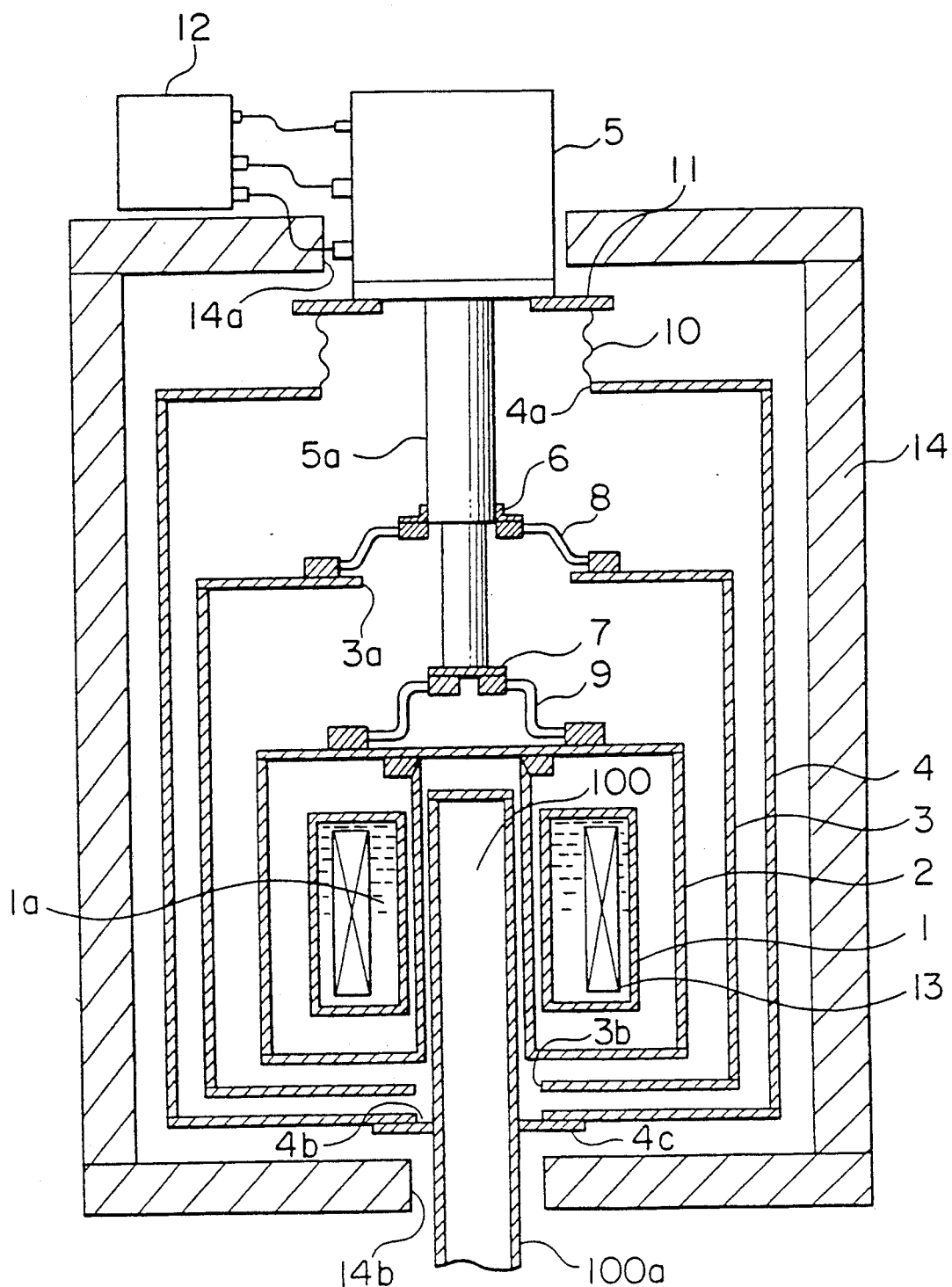
FIG. 1 is a side elevational cross-sectional view showing a conventional cryogenic refrigeration apparatus of the above-described kind.
Figure 2:
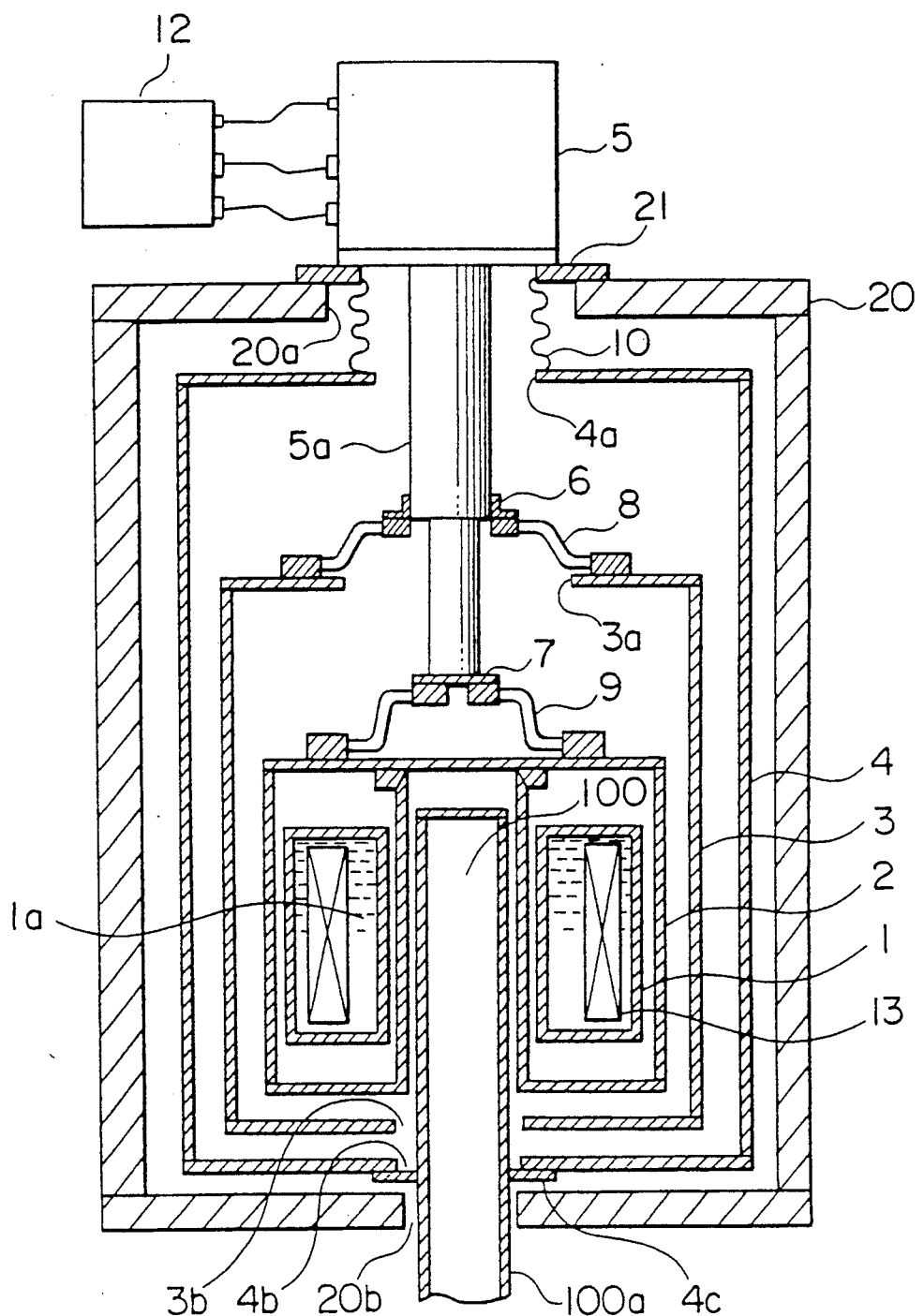
FIG. 2 is a side elevational cross-sectional view showing a preferred embodiment of a cryogenic refrigeration apparatus according to the present invention.

A preferred embodiment of the present invention will be explained below with reference to the accompanying drawings. FIG. 2 is a side elevational cross-sectional view showing the embodiment of the present invention. In FIG. 2, the same reference numerals are used to denote elements which correspond to or are identical to those shown in FIG. 1, and an explanation thereof will be omitted.

Referring to FIG. 2, a refrigerator 5 is airtightly supported on a magnetic shield 20 by an intervening flange 21. The refrigerator 5 may be airtightly disposed in direct contact with the magnetic shield 20.

In the cryogenic refrigeration apparatus which is arranged in the above-described manner, since the refrigerator 5 is supported on the thick-walled magnetic shield 20 of high rigidity, vibration produced by the running of the refrigerator 5 is reduced by the magnetic shield 20, and the vibration thus reduced is absorbed by the bellows 10. Accordingly, vibration which is transmitted to the vacuum vessel 4 is extremely reduced, and noise is prevented from occurring due to the vibration of the vacuum vessel 4.

What is claimed is:

1. A cryogenic refrigeration apparatus, comprising:
   a cryogenic vessel which accommodates a superconducting coil immersed in a cryogenic cooling medium and which is disposed in surrounding relationship to an electromagnetic cavity in which a magnetic field is produced by said superconducting coil;
   a vacuum vessel disposed outwardly of said cryogenic vessel with a vacuum area interposed therebetween and provided with means defining an opening;
   thermal shield means which includes at least one layer disposed between said vacuum vessel and said cryogenic vessel;
   a magnetic shield disposed outwardly of said vacuum vessel for preventing a magnetic flux produced by said superconducting coil from leaking to the exterior, said magnetic shield having a wall thickness greater than said vacuum vessel;
   cooling means securely supported on said magnetic shield for cooling said thermal shield means;
   heat conducting means connected between said cooling means and said thermal shield means through said opening of said vacuum vessel for conducting to said thermal shield means a cooling effect provided by said cooling means;
   vibration absorbing means connected between said magnetic shield and said vacuum vessel so as to define said vacuum area which accommodates said cryogenic vessel and said thermal shield means, said vibration absorbing means having elasticity which substantially prevents vibration produced by said cooling means from being transmitted from said magnetic shield to said vacuum vessel; and
   access means for providing external access to a magnetic field which is produced in said electromagnetic cavity by said superconducting coil.

2. A cryogenic refrigeration apparatus according to claim 1, wherein said magnetic shield includes means defining an opening which allows said heat conducting means extend through said magnetic shield, said cooling means being airtightly secured in direct contact with an outside portion of said magnetic shield in which said opening is defined, said heat conducting means being connected between said cooling means and said thermal shield means through said openings of said magnetic shield and said vacuum vessel, respectively.

3. A cryogenic refrigeration apparatus according to claim 1, wherein said magnetic shield includes means defining an opening, and a flange for securing and supporting said cooling means, said cooling means being airtightly secured by intervening said flange on an outside portion of said magnetic shield in which said opening is defined, said heat conducting means being connected between said cooling means and said thermal shield means through said openings of said magnetic shield and said vacuum vessel, respectively, said vibration absorbing means being connected between said flange and said vacuum vessel.

4. A cryogenic refrigeration apparatus according to claim 1, wherein said vibration absorbing means is made from a bellows.

5. A cryogenic refrigeration apparatus according to claim 1, wherein said cooling means is made up of a refrigerator and a compressor unit for supplying electrical power and cooling gas to said refrigerator.

* * * * *